United States Patent [19]

Ahn et al.

[11] Patent Number: 5,358,888
[45] Date of Patent: Oct. 25, 1994

[54] METHOD FOR MANUFACTURING A CAPACITOR OF AN INTEGRATED SEMICONDUCTOR DEVICE HAVING INCREASED SURFACE AREA

[75] Inventors: Ji-hong Ahn, Seoul; Young-woo Seo, Kyungsangbak-do, both of Rep. of Korea

[73] Assignee: Samsung Electronics Co., Ltd., Kyungki-Do, Rep. of Korea

[21] Appl. No.: 992,905

[22] Filed: Dec. 18, 1992

[30] Foreign Application Priority Data

Dec. 18, 1991 [KR] Rep. of Korea .................. 91-23392

[51] Int. Cl.⁵ .................. H01L 21/70; H01L 27/00
[52] U.S. Cl. .................. 437/52; 437/60; 437/919
[58] Field of Search .................. 437/47, 52, 60, 919

[56] References Cited

U.S. PATENT DOCUMENTS 5,134,086  7/1992  Ahn .................. 437/52
5,204,280  4/1993  Dhong et al. .................. 437/52

OTHER PUBLICATIONS

A Capacitor-Over-Bit-line (COB) Cell with a Hemispherical-Grain Storage Node for 64Mb DRAMs, by M. Sakao et al., IGDM 1990, pp. 655–658.
A New Stacked Capacitor DRAM Cell Characterized By A Storage Capacitor On A Bit-Line Structure S. Kimura, Y. Kawamoto, T. Kure, N. Hasegawa, J. Etoh, M. Aoki, E. Takeda, Hl. Sunami & K. Itoh; 1988 Central Research Laboratory, Hitachi Ltd., Kokubunji, Tokyo 185 Japan.

*Primary Examiner*—Olik Chaudhuri
*Assistant Examiner*—H. Joy Tsai
*Attorney, Agent, or Firm*—Cushman, Darby & Cushman

[57] ABSTRACT

A method for manufacturing a capacitor of a highly integrated semiconductor memory device includes the steps of forming a conductive layer on the whole surface of a semiconductor substrate, forming a first material layer on the whole surface of the conductive layer, forming a polysilicon layer having hemispherical grains on the whole surface of the first material layer, forming a first material layer pattern by performing an etching on the first material layer, using the polysilicon layer as an etch-mask, partially removing the conductive layer by anisotropically etching the conductive layer, using the first material layer pattern as an etch-mask, defining the conductive layer into an individual unit cell, and removing the first material layer pattern. Since greater cell capacitance can be secured by a simple process, this method can be adopted to manufacturing semiconductor memory devices having packing densities up to 64 Mb and 256 Mb.

6 Claims, 12 Drawing Sheets

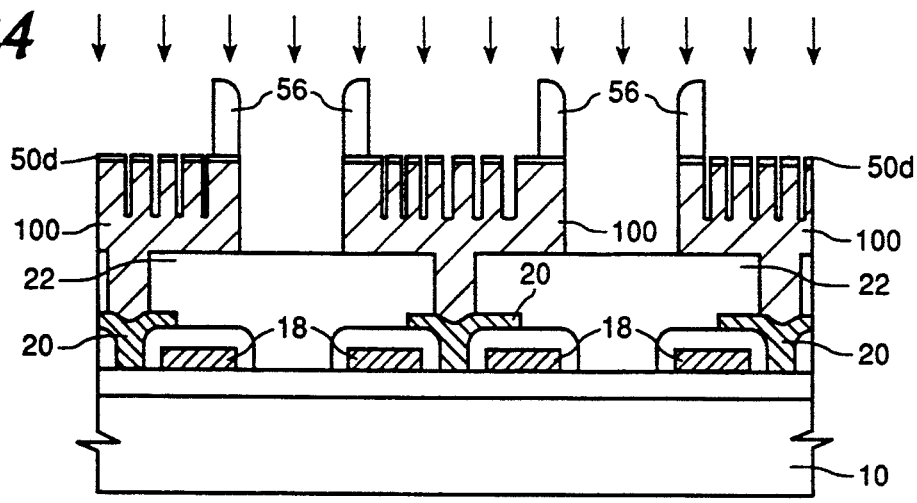
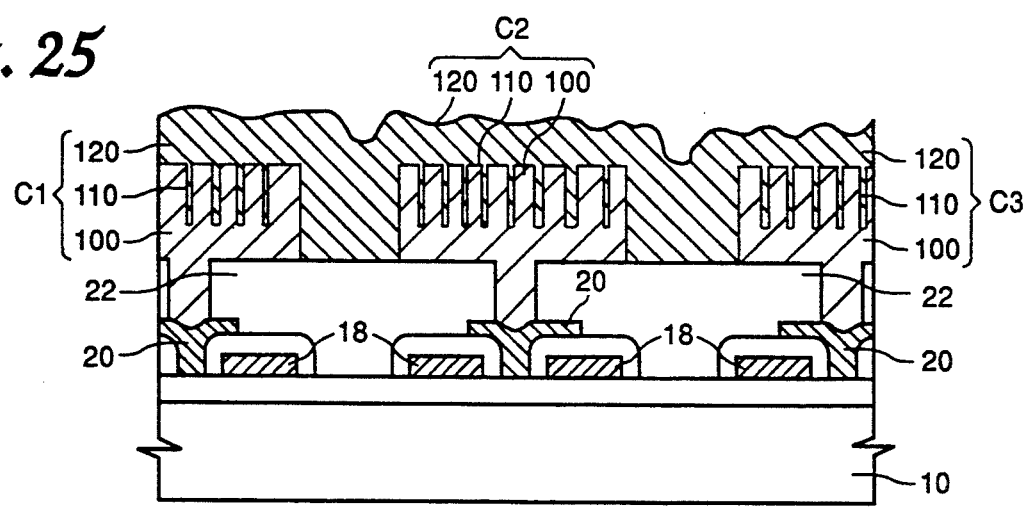
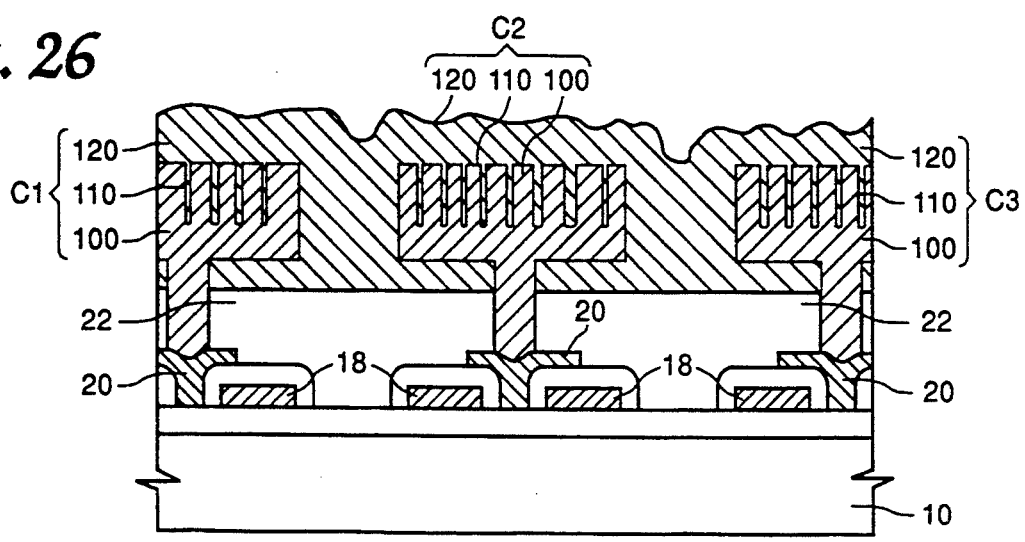

METHOD FOR MANUFACTURING A CAPACITOR OF AN INTEGRATED SEMICONDUCTOR DEVICE HAVING INCREASED SURFACE AREA

BACKGROUND OF THE INVENTION

1. Field of the Invention

The present invention relates to a method for manufacturing a semiconductor memory device, and more particularly to a method for manufacturing a capacitor of a highly integrated semiconductor memory device, which increases cell capacitance, using a polysilicon having hemispherical grains (HSG) formed on an oxide layer.

2. Description of the Related Art

Increasing cell capacitance enhances read-out ability and decreases soft error rate of memory cells greatly contributing to the enhancement of memory characteristics in dynamic random access memories (DRAMs). Along with the increase of the packing density in the memory cell, an area occupied by an individual unit cell of a single chip is decreased, which decreases the cell capacitor area and decrease of cell capacitance. Accordingly, increased capacitance secured in an individual unit cell is an important factor in increasing packing density.

Research papers on increasing cell capacitance have been recently published, wherein a fin-structured electrode of Fujitsu Co., a box-structured electrode and a spread-stacked capacitor structure electrode of Toshiba Co., and a cylindrical structured electrode of Mitsubishi Co., etc., relate to the structure of a storage electrode constituting a cell capacitor. However, the attempt to increase the cell capacitance by improving the structure of a storage electrode faces difficulties such as restricting the design rule and increasing the error rate due to the complicated process, which thus casts doubt whether the capacitor can be actually manufactured. Accordingly, the need for a manufacturing method of a novel cell capacitor which overcomes the foregoing problem is increasingly heightened.

A method has been proposed for increasing the cell capacitance by utilizing a property of a material constituting a storage electrode without depending on structural improvement. This method will be briefly described with reference to "A Capacitor-Over-Bit Line (COB) Cell with a Hemispherical-grain Storage Node for 64 Mb DRAMs," introduced by NEC., Japan, in IEDM (Ref., M. Sakao et al., IEDM Tech. Dig, 1990, pp. 655–658).

FIG. 1 is a diagram showing a layout for manufacturing a capacitor-over bit line (COB) cell presented in the above paper. A portion denoted by a single-dashed line which transversely extends is a mask pattern P1 for active region formation. Solid-lined symmetrical portions are a mask pattern P2 for gate electrode formation. Portions denoted by long-dotted lines and has two symmetrically extending arms and centers the layout are a mask pattern P3 for forming a local wiring which connects a source region to a storage electrode. A transversely extending portion denoted by a double-dashed line having a contact mark therein is a mask pattern P4 for bit line formation. Portions denoted by short-dotted lines which are drawn as matrices is a mask pattern P5 for storage electrode formation.

A cell capacitor is formed on a bit line in the COB cell. After forming a bit line to be connected to a drain region of a transistor, an insulating material is coated on the whole surface of a substrate, so that the bit line is electrically insulated. Successively, the insulating material is partially removed to expose a region which is electrically connected to a source region of a transistor. A storage electrode is formed on the insulating material, and is connected to the source region of the transistor through the partially removed portion of the insulating material. This structure is suitable for 64 Mb and 256 Mb DRAM cells, and which is introduced for preventing contact failure of the bit line.

FIGS. 2 through 5 are sectional views illustrating a method for manufacturing a capacitor of a conventional high integrated semiconductor memory device, taken along line A-A' of FIG. 1.

In the NEC paper, a polysilicon having hemispherical grains (hereinafter referred to as HSG polysilicon) is produced thanks to a specific physical phenomenon during state transition of an amorphous silicon to a polysilicon. In more detail, when an amorphous silicon is deposited on the substrate, and then is subjected to heat, the amorphous silicon forms microscopic hemispherical grains at a specific temperature and pressure, e.g., at 550° C. and 1.0 torr. Therefore, the state of the amorphous silicon changes to an intermediary polysilicon having a rugged surface due to the grains. The rugged surface doubles or triples the surface area as compared with a smooth surface.

As shown in FIG. 2, after forming an insulating layer 22 (which is two or three stacked insulating layers) on the whole surface of a semiconductor substrate 10 on which a gate electrode 18 of a transistor, a bit line (not shown) in contact with a drain region of the transistor, and a local wiring 20 in contact with a source region of the transistor are formed, a contact hole 9 is formed via anisotropically etching partially exposing local wiring 20. Successively, after forming a first polysilicon having a predetermined thickness on the insulating layer along with filling contact hole 9 completely, an etching is carried out, using mask pattern P5, so that a central storage electrode 30 is formed by being defined into an individual unit cell.

Referring to FIG. 3, as HSG polysilicon layer 32 is formed on the whole surface of semiconductor substrate 10 having central storage electrode 30 thereon, which is formed via a common depositing method, e.g., low-pressure chemical vapor deposition (LPCVD), except a specific temperature and pressure is used, e.g., 550° C. and 1.0 torr. Due to the microscopic hemispherical grains, the effective area of the HSG polysilicon layer is increased to approximately twice the conventional polysilicon layer (i.e., without the HSG). At this time, since the hemispherical grains have a diameter of about 80 nm, HSG polysilicon layer 32 must be thicker than 80 nm but yet thinner than half the distance between two adjacent central storage electrodes 30.

As shown in FIG. 4, HSG polysilicon layer 32 is etched-back through a reactive ion etching (RIE), using HBr gas without requiring an additional etch-mask. This etch-back is carried out until the surface of insulating layer 22 between each central storage electrode 30 is partially exposed in order to divide the storage electrode into an individual unit cell. HSG polysilicon layer 32 coated on the upper surface of the central storage electrode is thoroughly removed during the etch-back process. Thereafter, only the rugged surface shape is left on the surface of central storage electrode 30, and the roughness of the HSG polysilicon layer 32a on the side surface of the central storage electrode is eased. The storage electrode consists of central storage electrode 30a having the rugged surface and HSG polysilicon layer 32a left after the etching process.

Referring to FIG. 5, after forming a dielectric film 34 on the whole surface of the storage electrode, a second polysilicon layer is coated on the whole surface of semiconductor substrate 10 to form a plate electrode 36 completing a cell capacitor.

The above-described method for manufacturing a capacitor of a memory cell is advantageous in that, since a physical property of the material is used for enlarging the effective area of a cell capacitor without depending on the structural improvement of a storage electrode, the cell capacitor can be manufactured by a simple process without being restricted by design rule. However, this method has a drawback in that the increased effective area of the capacitor is limited to only twice per unit area.

SUMMARY OF THE INVENTION

It is the object of the present invention to provide a method for manufacturing a capacitor of a highly integrated semiconductor memory device capable of increasing an effective area of a cell capacitor.

To achieve the object of the present invention, there is provided a method for manufacturing a capacitor of a highly integrated semiconductor memory device comprising the steps of:

forming a conductive layer on the whole surface of a semiconductor substrate;

forming a first material layer on the whole surface of the conductive layer;

forming a polysilicon layer having hemispherical grains on the whole surface of the first material layer;

forming a first material layer pattern by performing an etching on the first material layer, using the polysilicon layer as an etch-mask;

partially removing the conductive layer by anisotropically etching the conductive layer, using the first material layer pattern as an etch-mask;

defining the conductive layer into an individual unit cell; and removing the first material layer pattern.

Preferably, there is provided a method for manufacturing a capacitor of a highly integrated semiconductor memory device comprising the steps of:

forming a conductive layer on the whole surface of a semiconductor substrate;

forming a first material layer on the whole surface of the conductive layer;

forming a second material layer on the whole surface of the first material layer;

forming a second material layer pattern for storage electrode formation, by patterning the second material layer, using a mask pattern for storage electrode formation;

forming a third material layer on the whole surface of the resultant structure having the second material layer pattern thereon;

forming a spacer on the sidewall of the second material layer pattern by anisotropically etching the third material layer;

forming a 1st first-material layer pattern for storage electrode formation by anisotropically etching the first material layer, using the second material layer pattern and the spacer as etch-masks;

forming a conductive layer pattern for storage electrode formation by etching the conductive layer, using the 1st first-material layer pattern as an etch-mask;

forming a polysilicon layer having hemispherical grains on the whole surface of the resultant structure;

forming a 2nd first-material layer pattern by etching the first material layer, using the polysilicon layer as an etch-mask;

partially removing the conductive layer pattern by anisotropically etching the conductive layer, using the 2nd first-material layer pattern as an etch-mask; and removing the 2nd first-material layer pattern.

Preferably, there is provided a method for manufacturing a capacitor of a highly integrated semiconductor memory device comprising the steps of:

forming a conductive layer on the whole surface of a semiconductor substrate;

forming a first material layer on the whole surface of the conductive layer;

forming a polysilicon layer having hemispherical grains on the whole surface of the first material layer;

forming a fourth material layer on the whole surface of the resultant structure having the polysilicon layer thereon;

forming a fourth material layer pattern for storage electrode formation by patterning the fourth material layer, using a mask pattern for storage electrode formation;

forming a fifth material layer on the whole surface of the resultant structure having the fourth material layer pattern thereon;

forming a spacer on the sidewall of the fourth material layer pattern by anisotropically etching the fifth material layer;

forming a conductive layer pattern for storage electrode formation by anisotropically etching on the whole surface of the resultant structure, using the fourth material layer pattern and the spacer as etch-masks;

removing the fourth material layer pattern;

forming a first material layer pattern for storage electrode formation by etching the first material layer, using the polysilicon layer as an etch-mask;

completing a storage electrode by partially removing the conductive layer pattern, using the first material layer pattern and the spacer as etch-masks; and removing the first material layer pattern and the spacer.

Preferably, there is provided a method for manufacturing a capacitor of a highly integrated semiconductor memory device comprising the steps of:

forming a conductive layer on the whole surface of a semiconductor substrate;

forming a first material layer on the whole surface of the conductive layer;

forming a sixth material layer on the whole surface of the first material layer;

forming a sixth material layer pattern for storage electrode formation by patterning the sixth material layer, using a mask pattern for storage electrode formation;

forming a seventh material layer on the whole surface of the resultant structure having the sixth material layer pattern thereon;

forming a spacer on the sidewall of the sixth material layer pattern by anisotropically etching the seventh material layer;

forming a conductive layer pattern for storage electrode formation by anisotropically etching the resultant structure, using the sixth material layer pattern and the spacer as etch-masks;

removing the sixth material layer pattern;

forming a polysilicon layer having hemispherical grains on the whole surface of the resultant structure;

forming a first material layer pattern for storage electrode formation by etching the first material layer, using the polysilicon layer as an etch-mask;

completing a storage electrode by partially removing the conductive layer pattern, using the first material layer pattern and the spacer as etch-masks; and removing the first material layer pattern and said spacer.

BRIEF DESCRIPTION OF THE DRAWINGS

The above objects and other advantages of the present invention will become more apparent by describing in detail a preferred embodiment thereof with reference to the attached drawings in which:

FIGS. 21 through 25 are sectional views showing a fourth embodiment of the method for manufacturing the capacitor of the highly integrated semiconductor memory device according to the present invention; and FIG. 26 is a sectional view showing a semiconductor memory device manufactured by a fifth embodiment of a method for manufacturing a capacitor of a highly integrated semiconductor memory device according to the present invention.

DETAILED DESCRIPTION OF THE PREFERRED EMBODIMENTS

Figure 1:
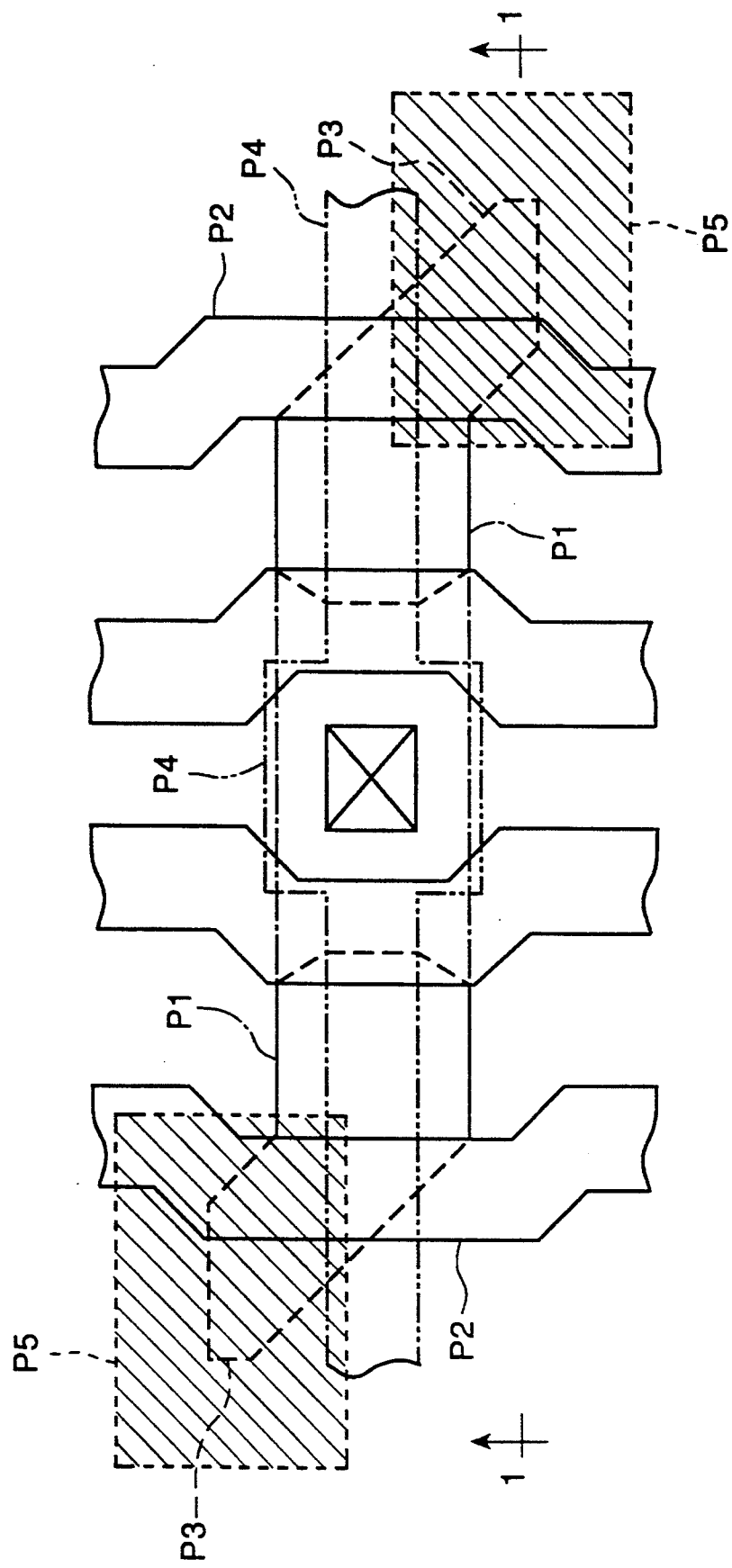
FIG. 1 shows a layout of a conventional capacitor-over-bit line cell for manufacturing a highly integrated semiconductor memory device.
Figure 2:
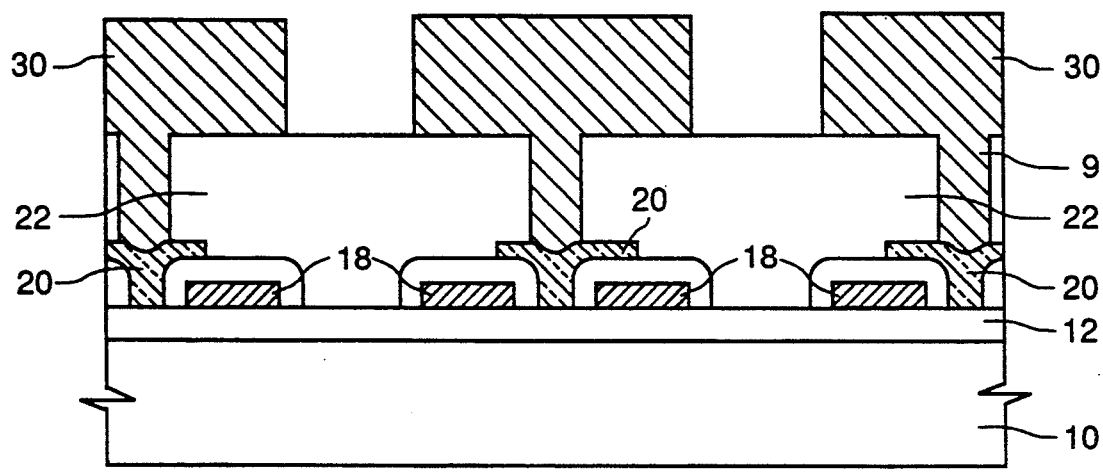
FIGS. 2 through 5 are sectional views showing a conventional method for manufacturing a capacitor of a highly integrated semiconductor memory device.
Figure 3:
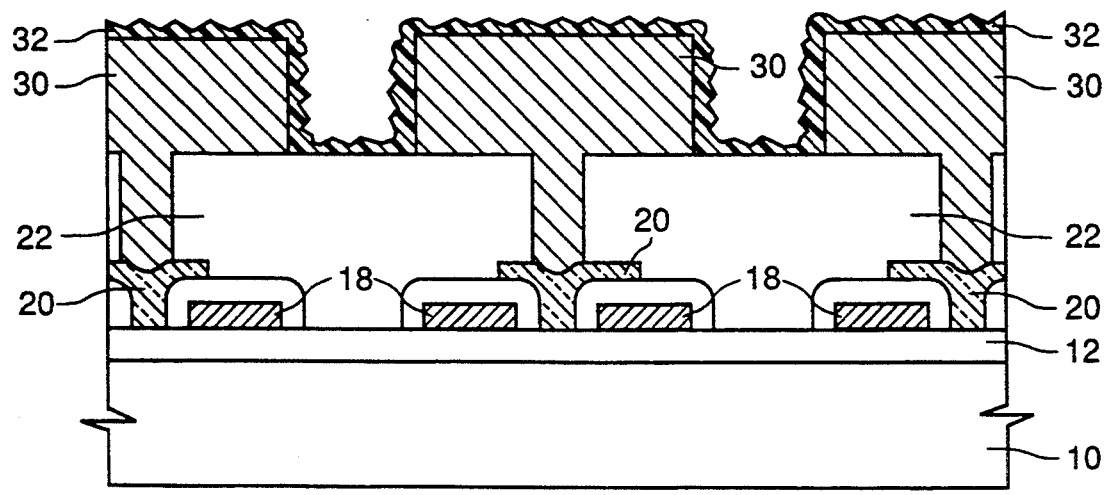
Figure 4:
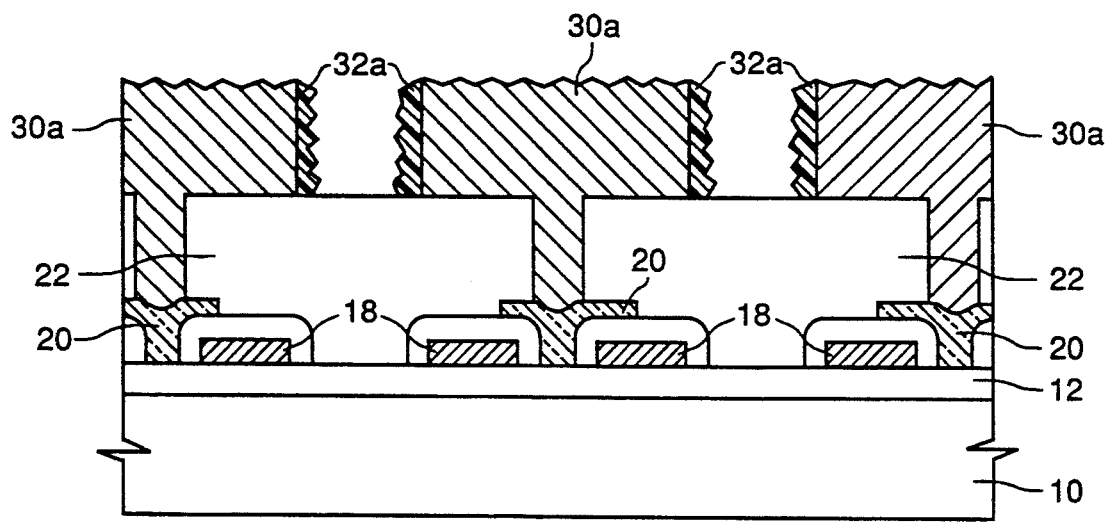
Figure 5:
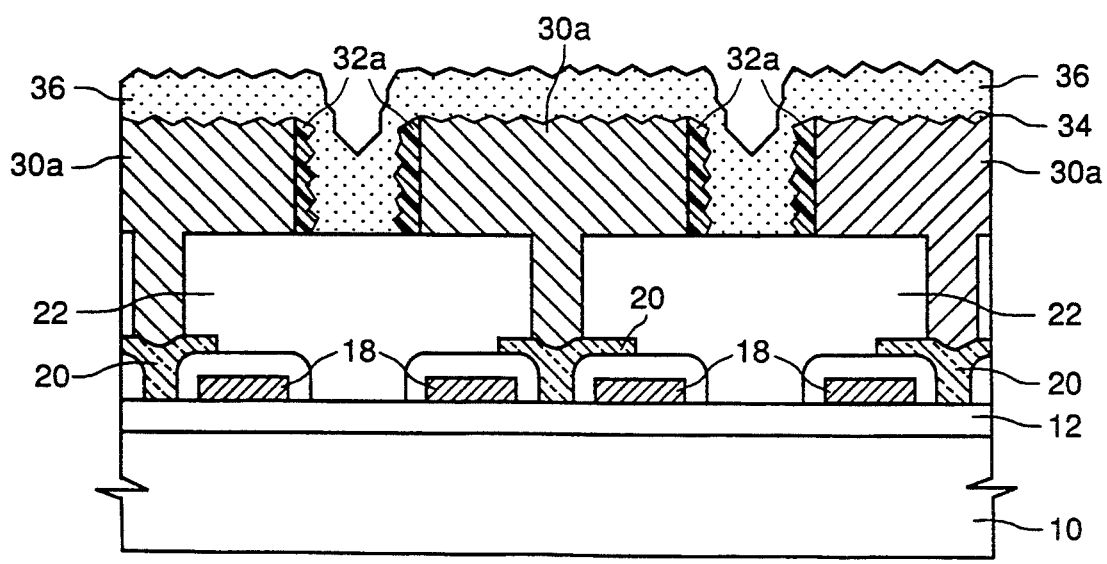

Same reference numerals of FIGS. 2 through 5 designate like portions in the following description.

Figure 6:
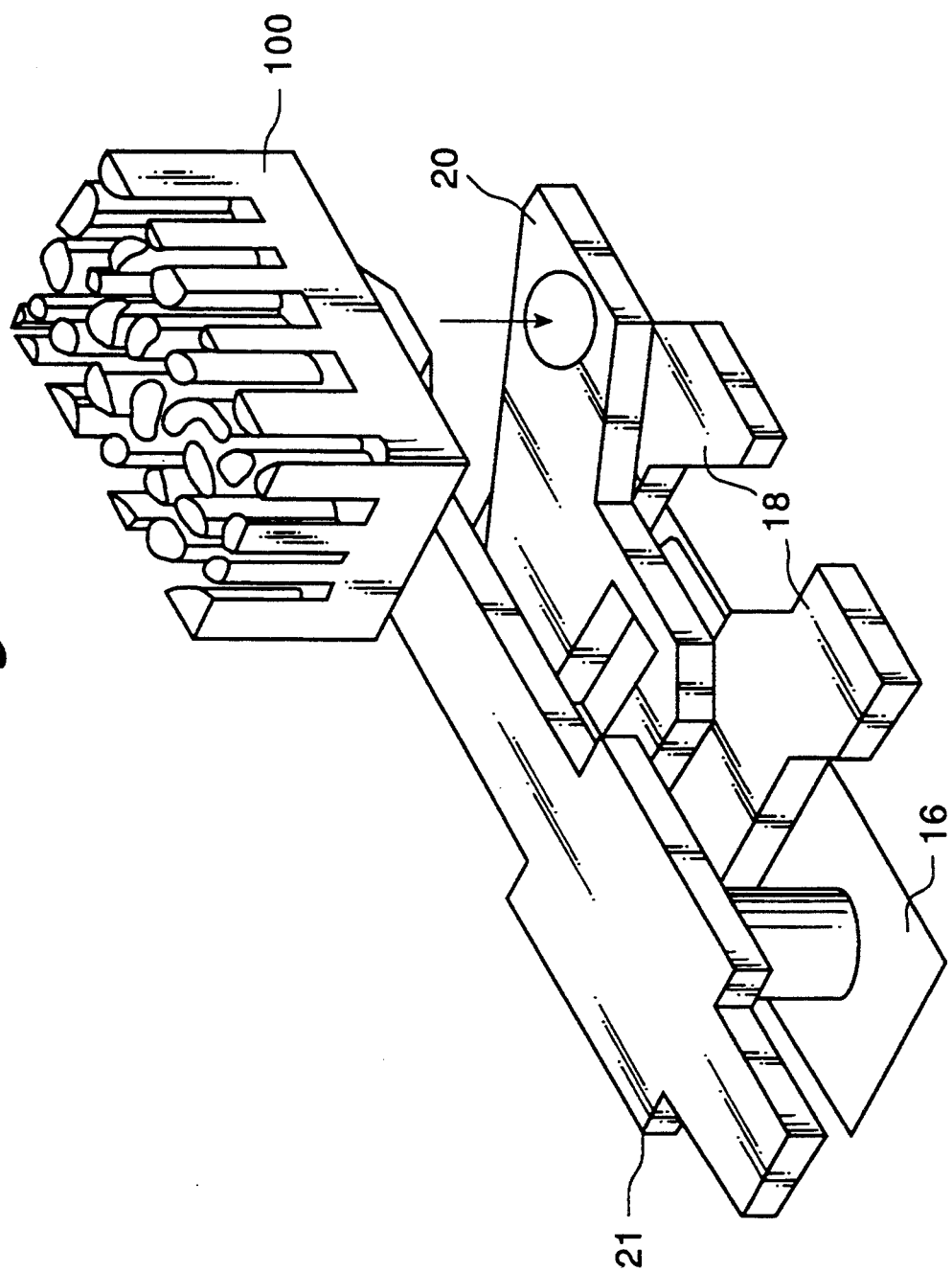
FIG. 6 is a perspective view showing a highly integrated semiconductor memory device manufactured by one aspect of a method for manufacturing a capacitor of a highly integrated semiconductor memory device according to the present invention.

FIG. 6 illustrates a highly integrated semiconductor memory device manufactured by one embodiment of a method according the present invention, using the mask pattern shown in FIG. 1. The memory device includes: a transistor consisting of a source region (not shown), a drain region 16 a gate electrode 18, and a local wiring 20 for connecting the source region of the transistor to a storage electrode 100, a bit line 21 connected to drain region 16 of the transistor and the storage electrode 100.

FIGS. 7 through 10 are sectional views illustrating a first embodiment of a method for manufacturing the highly integrated semiconductor memory device according to the present invention.

Figure 7:
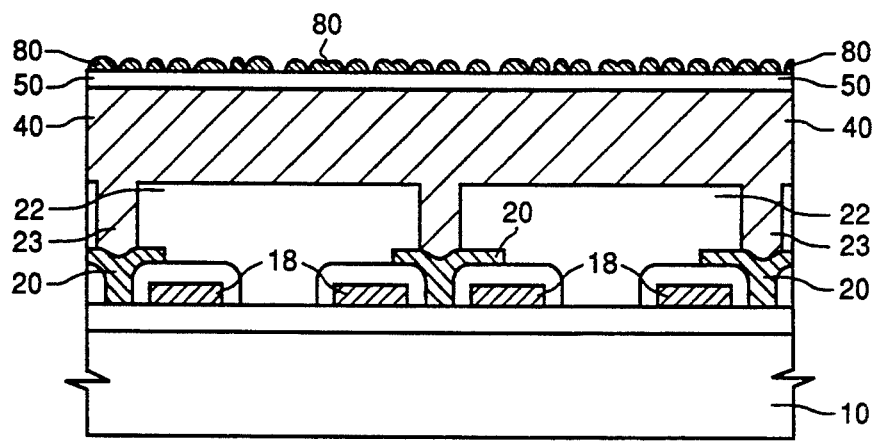
FIGS. 7 through 10 are sectional views showing a first embodiment of the method for manufacturing the capacitor of the highly integrated semiconductor memory device according to the present invention.

FIG. 7 illustrates a step of stacking a conductive layer 40, a first material layer 50 and a polysilicon layer 80 having hemispherical grains (hereinafter, referred to an HSG layer). After forming an insulating layer 22 (two or three insulating layers stacked) on the whole surface of a semiconductor substrate 10 on which local wiring 20 in contact with the source region of the transistor and a bit line in contact with a drain region are formed, to have a planarized surface. An anisotropic etching is performed to form a contact hole 23 for partially exposing local wiring 20. Then, a conductive material, e.g., a polysilicon, is deposited to fill up contact hole 23 to a predetermined thickness on the planarized insulating layer, e.g., about 2,000 Å, via an LPCVD. At this time, since the thickness of conductive layer 40 is directly related to the finally obtained cell capacitance, it is preferable to set the thickness after calculating a desired cell capacitance. Successively, a material which has an etch rate different from that of conductive layer 40 with respect to any anisotropic etching, and can isolate grains constituting the HSG layer from one another so as to form individual islands providing that the HSG layer is formed on the material, e.g., oxide, is coated on the whole surface of conductive layer 40 in a thickness of approximately 300 to 1,000 Å, thereby forming a first material layer 50. Then, HSG layer 80 is formed on the whole surface of first material layer 50. The HSG layer may be formed under the same state as the conventional HSG layer described above (550° C. and 1.0 torr), or a state as in recently reported methods (e.g., 590° C. and 1.0 torr). The characteristic is in that since the grains constituting the HSG layer are slightly separated from one another, thereby being formed as a group of islands. That is, first material layer 50 is partially exposed through HSG layer 80.

Figure 8:
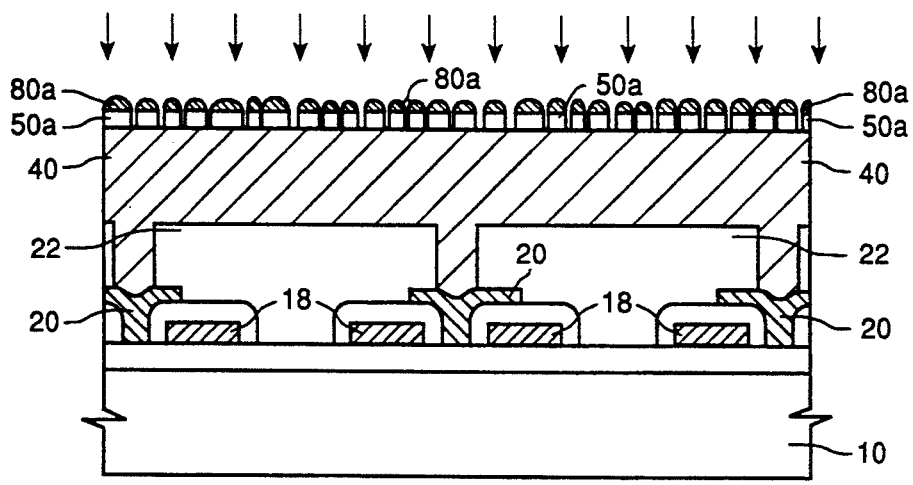

FIG. 8 illustrates a step of forming a first material layer pattern 50a. An anisotropic etching is carried out upon the surface of the first material layer (reference numeral 50 in FIG. 7), using HSG layer 80 as an etch-mask, so that the surface of the first material layer partially exposed by means of the HSG layer is eliminated, thereby forming first material layer pattern 50a. It is appreciated that, if the HSG layer has an etch rate different from that of the first material layer with respect to any anisotropic etching, it is enough to function as an etch-mask during the anisotropic etching. Furthermore, to widen the distance between the grains constituting the HSG layer, a wet etching can be added. This is because, a too narrow distance between the grains may cause difficulty in the formation of a dielectric film and a plate electrode.

Figure 9:
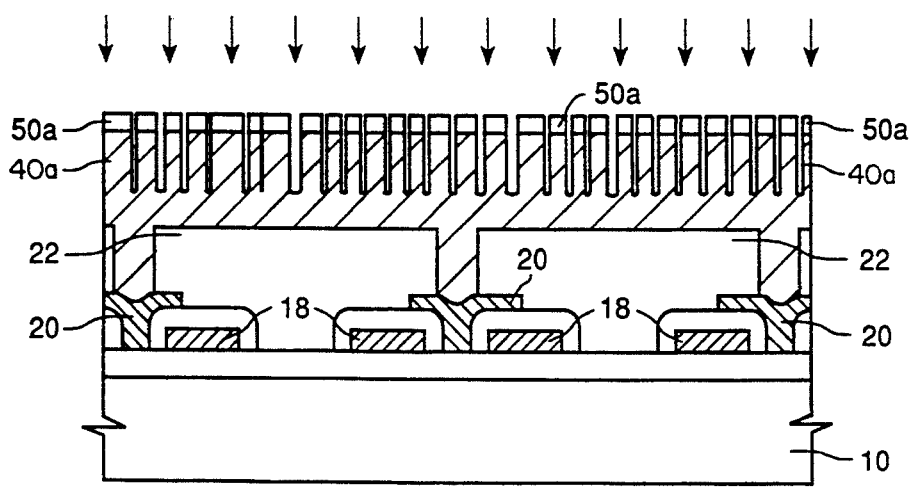

FIG. 9 illustrates a step of performing an anisotropic etching upon the whole surface of the resultant structure, using first material layer pattern 50a as an etch-mask. The anisotropic etching is carried out on the whole surface of the resultant structure having first material layer pattern 50a thereon, using first material layer pattern 50a as an etch-mask, and the conductive layer (reference numeral 40 of FIG. 7) as an etched-object, so that the conductive layer is partially etched to thereby form a conductive layer pattern 40a for a storage electrode formation. At this time, conductive layer pattern 40a is formed as bars of a predetermined height whose tops are composed of first material layer pattern 50a. This means that since the predetermined height can be adjusted by varying the time and the type of the enchant for anisotropic etching, cell capacitance can also be adjusted as desired.

Moreover, in the conventional method, with the rugged surface, the maximum effective capacitor area for securing cell capacitance is increased to only twice that of smooth surface. However, according to the conductive layer pattern (40a) in FIG. 9, the height of the bars or the hemispherical shape constituting the HSG layer can greatly increase the effective capacitor area in dependance upon the size of the grains. In the present invention, the grain diameter is approximately 200 Å to 1,000 Å.

Figure 10:
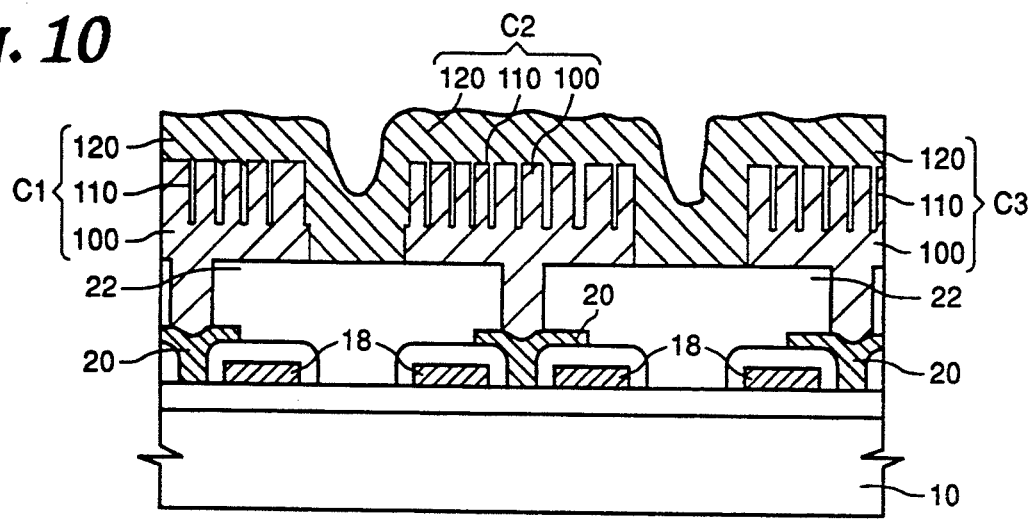

FIG. 10 illustrates a step of forming storage electrode 100, a dielectric film 110 and a plate electrode 120. Using the mask pattern for the storage electrode formation (reference symbol P5 of FIG. 1), conductive layer 40a is patterned to thereby form storage electrode 100 which is defined into an individual unit cell. Then, dielectric film 110 is formed on the whole surface of storage electrode 100. Successively, plate electrode 120 is completed by depositing a conductive material, e.g., a polysilicon doped with an impurity, on the whole surface of the resultant structure having dielectric film 110 thereon. It can be noted that a single capacitor (C1, C2 or C3) is formed of storage electrode 100, dielectric film 110 and plate electrode 120.

FIGS. 11 through 15 are sectional views showing a second embodiment of the method for manufacturing the capacitor of the highly integrated semiconductor memory device according to the present invention, wherein greater cell capacitance is secured than that obtained according to the first embodiment.

Figure 11:
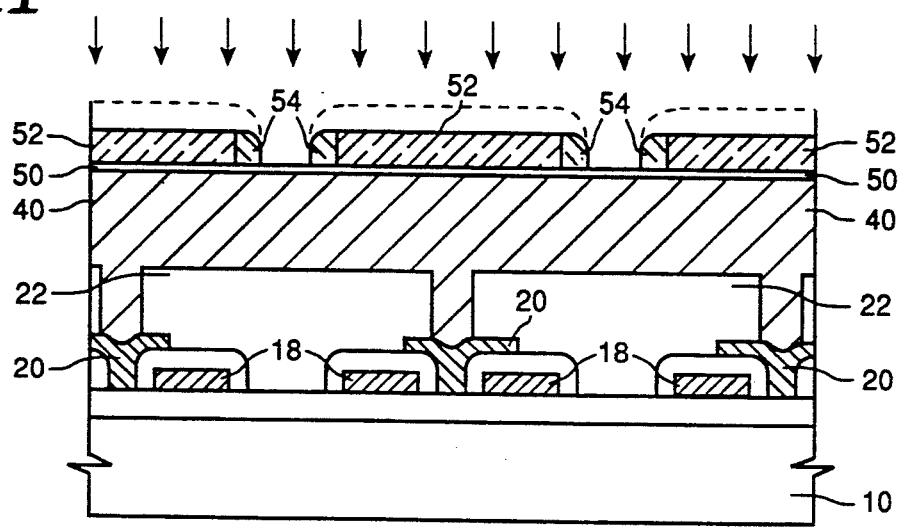
FIGS. 11 through 15 are sectional views showing a second embodiment of the method for manufacturing the capacitor of the highly integrated semiconductor memory device according to the present invention.

FIG. 11 illustrates a step of forming a second material layer pattern 52 and a spacer 54 on semiconductor substrate 10 on which conductive layer 40 and first material layer are stacked. After stacking conductive layer 40 and first material layer 50 as described with reference to FIG. 7, a material having an etch rate different from the material constituting the first material layer with respect to any anisotropic etching, e.g., a first polysilicon in a thickness of about 1,000 Å to 3,000 Å, is deposited on the whole surface of the first material layer, thereby forming a second material layer. Then, second material layer pattern 52 is formed by applying mask pattern P5 for storage electrode formation shown in FIG. 1. Successively, a third material layer is formed by depositing a material having an etch rate different from the material constituting the first material layer with respect to any anisotropic etching, e.g., a second polysilicon, on the whole surface of the resultant structure. Thereafter, the third material layer is anisotropically etched, so that spacer 54 composed of the third material layer is formed on the sidewall of second material layer pattern 52.

Figure 12:
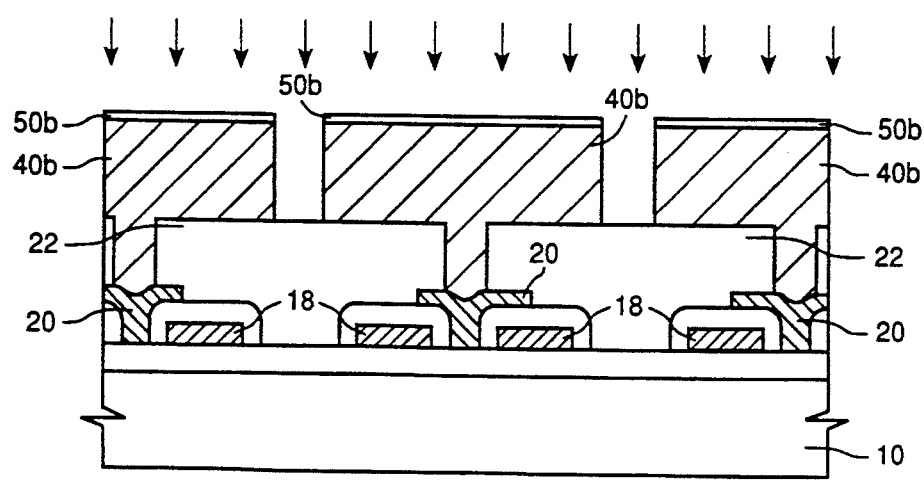

FIG. 12 illustrates a step of forming a 1st first-material layer pattern 50b of a first material type (hereafter referred to as 1st first-material layer) and a conductive layer pattern 40b. Using the second material layer pattern 52 and spacer 54 as etch-masks, the entire surface of the 1st first-material layer is anisotropically etched to thereby form 1st first-material layer pattern 50b. Also, using the 1st first-material layer pattern 50b as an etch-mask, the entire surface of the resultant structure is anisotropically etched to partially remove conductive layer 40, thereby forming conductive layer pattern 40b. Preferably, the sidewall of conductive layer pattern 40b has an inclination which is not negative for facilitating the formation of a dielectric film (110 in FIG. 15) and a plate electrode (120 in FIG. 15) which will be formed in subsequent steps. At this time, second material layer pattern 52 and spacer 54 are removed via a wet etching after forming 1st first-material layer pattern 50b, or etched together with conductive layer 40 during the anisotropic etching for forming conductive layer pattern 40b. Greater cell capacitance than that of the first embodiment can be achieved because the conductive layer pattern 40b for storage electrode formation expands by the traversal thickness of the spaces.

Figure 13:
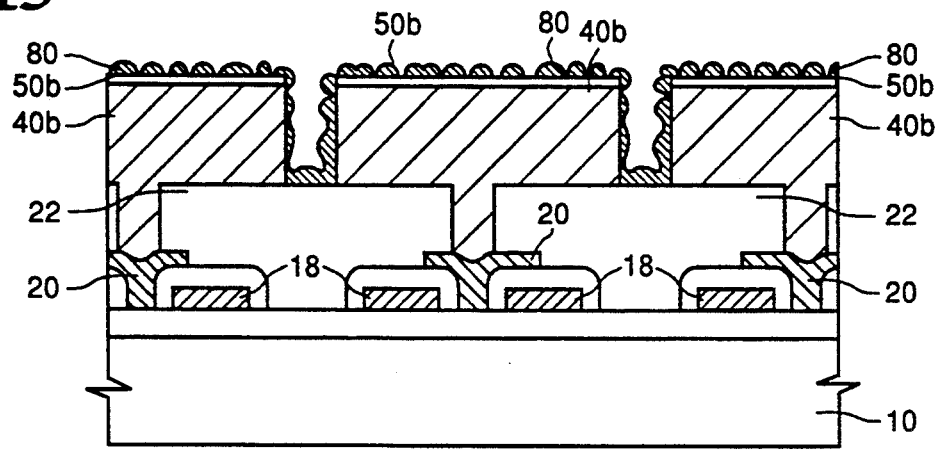

FIG. 13 illustrates the forming step of an HSG layer 80. As described in FIG. 7, HSG layer 80 is formed on the entire surface of the resultant structure on which 1st first-material layer 50b and conductive layer pattern 40b are formed. At this time, it should be appreciated that the HSG layer 80 formed on 1st first-material layer 50b is formed as a group of islands.

Figure 14:
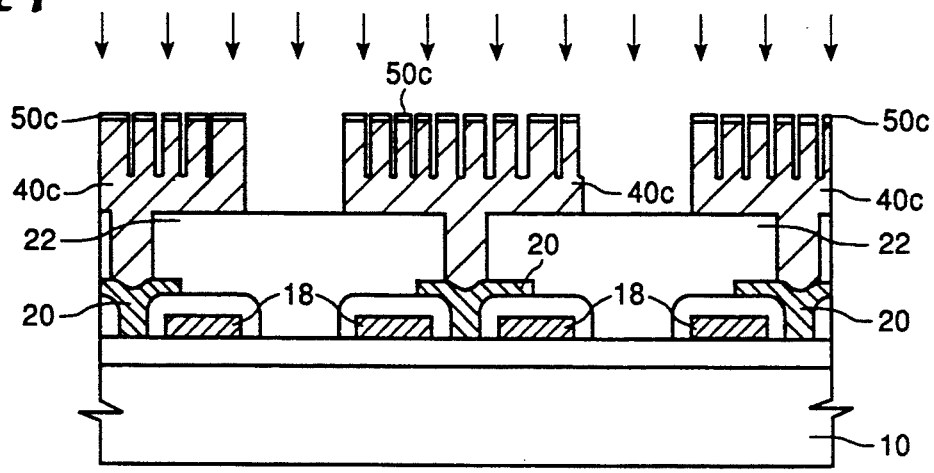

FIG. 14 illustrates the step of forming a second layer pattern 50c of the first material (hereafter referred to as the 2nd first-material layer) and a storage electrode 40c. As described in FIGS. 8 and 9, the first material layer is anisotropically etched, using the HSG layer as an etch-mask, thereby forming 2nd first-material layer pattern 50c. Then, the conductive layer is anisotropically etched, using 2nd first-material layer pattern 50c as an etch-mask, thereby forming the storage electrode. The HSG layer 80 is eliminated together with the conductive layer during the second anisotropic etching.

Figure 15:
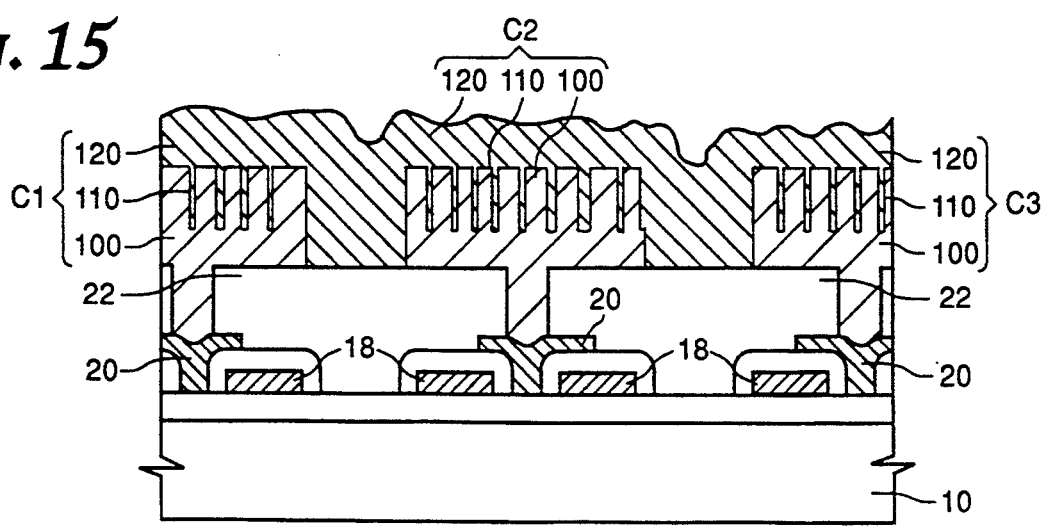

FIG. 15 illustrates the step of forming a dielectric film 110 and a plate electrode 120. After removing the 2nd first-material layer pattern (since the first material layer is generally composed of an oxide layer, the 2nd first-material layer pattern is removed by means of an oxide layer enchant), a high dielectric material is coated on the whole surface of the storage electrode (reference numeral 40c in FIG. 14) to thus form dielectric film 110. Successively, a conductive material, e.g., a polysilicon doped with an impurity, is deposited on the entire surface of the resultant structure, thereby completing plate electrode 120.

Even though the same mask pattern for the storage electrode formation is employed, greater capacitance can be obtained by means of the method according to the second embodiment than that of the method according to the first embodiment.

Figure 16:
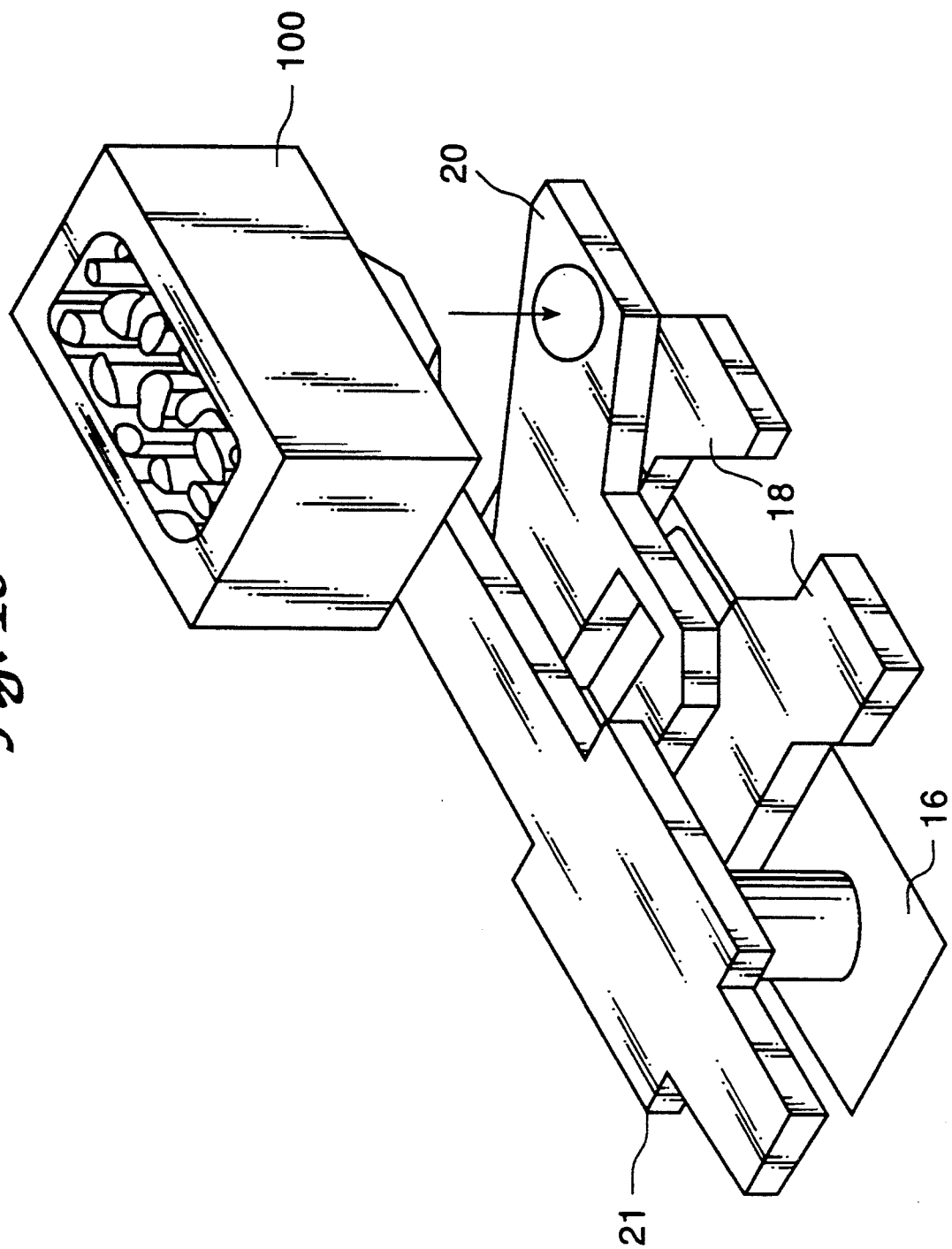
FIG. 16 is a perspective view showing a highly integrated semiconductor memory device manufactured by another aspect of a method for manufacturing a capacitor of a highly integrated semiconductor memory device according to the present invention.

FIG. 16 is a perspective view showing a highly integrated semiconductor memory device manufactured by another embodiment of a method for manufacturing a capacitor of a highly integrated semiconductor memory device according to the present invention. The structure is the same as that shown in FIG. 6 except for the shape of storage electrode 100. The storage electrode of the third embodiment is a modified cylindrical storage electrode, wherein a plurality of bars are formed within a cylinder.

FIGS. 17 through 20 are sectional views showing a third embodiment of the method for manufacturing the capacitor of the highly integrated semiconductor memory device according to the present invention. Cell capacitance and reliability of the storage electrode are increased by forming a cylindrical electrode having a plurality of bars therein.

Figure 17:
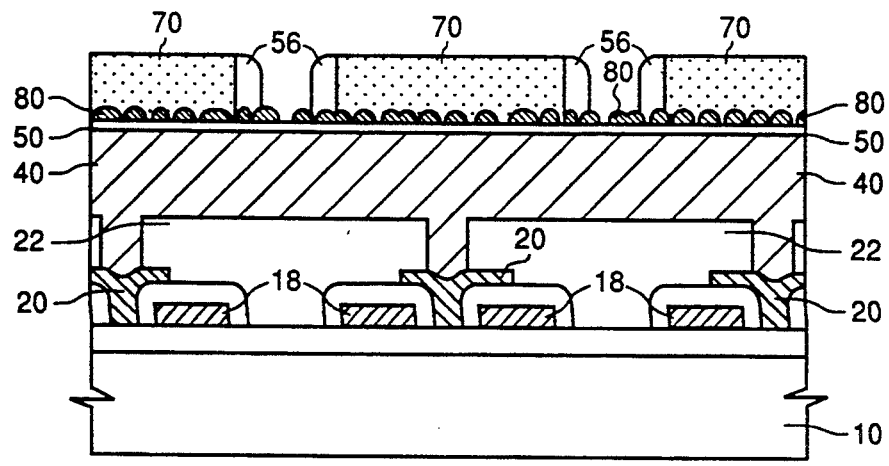
FIGS. 17 through 20 are sectional views showing a third embodiment of the method for manufacturing the capacitor of the highly integrated semiconductor memory device according to the present invention.

FIG. 17 illustrates the step of forming a spacer 56 composed of a fifth material layer and a fourth material layer pattern 70. As described with reference to FIG. 7, conductive layer 40, first material layer 50 and HSG layer 80 are stacked. Then, a material having an etch rate different from that of the material constituting the HSG layer and first material layer with respect to any isotropic etching (mainly wet etching), e.g., photoresist, is coated on the entire surface of the resultant structure, thereby forming the fourth material layer. Then, by patterning the fourth material layer by means of mask pattern P5 of FIG. 1, a fourth material layer pattern 70 is formed. Successively, a material having an etch rate different from that of the material constituting the fourth material and conductive layers with respect to any anisotropic etching, e.g., an oxide layer capable of being deposited at low temperature (if photoresist is used as the fourth material layer), is coated to a thickness of about 500 Å to 2,000 Å, so that the fifth material layer is formed. Thereafter, by performing an anisotropic etching on the whole surface of the resultant structure, spacer 56 is formed on the sidewall of fourth material layer pattern 70.

Figure 18:
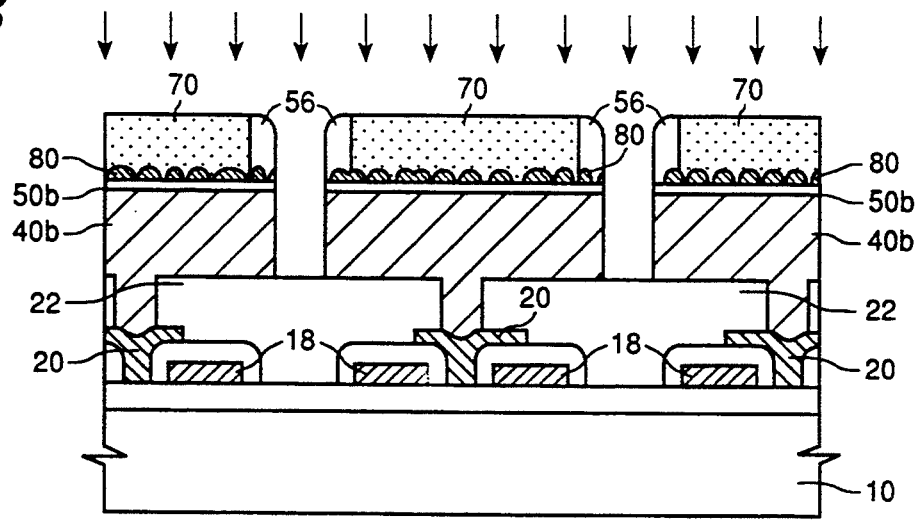

FIG. 18 illustrates the step of forming the 1st first-material layer pattern 50b and the conductive layer pattern 40b. Here, an anisotropic etching is performed upon the entire surface of the resultant structure, using fourth material layer pattern 70 and spacer 56 as etch-masks, so that HSG layer 80, first material layer 50, and conductive layer 40 are partially etched, thereby forming 1st first-material layer pattern 50b and conductive layer pattern 40b. At this time, since another etching which uses 1st first-material layer pattern 50b as an etch-mask will follow, the conductive layer may or may not be etched until insulating layer 22 is exposed by this etching process.

Figure 19:
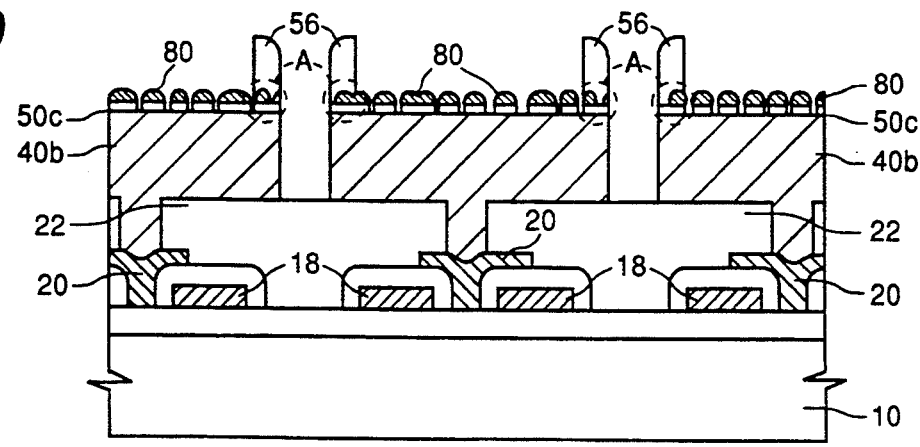

FIG. 19 illustrates the step of forming a 2nd first-material layer pattern 50c. The fourth material layer pattern (reference numeral 70 in FIG. 18) is removed via a wet etching. Thereafter, the first material layer whose surface is exposed through the HSG layer is removed by anisotropically etching the 1st first-material layer pattern (reference numeral 50b of FIG. 18), using HSG layer 80 as an etch-mask, so that 2nd first-material layer pattern 50c is formed.

Figure 20:
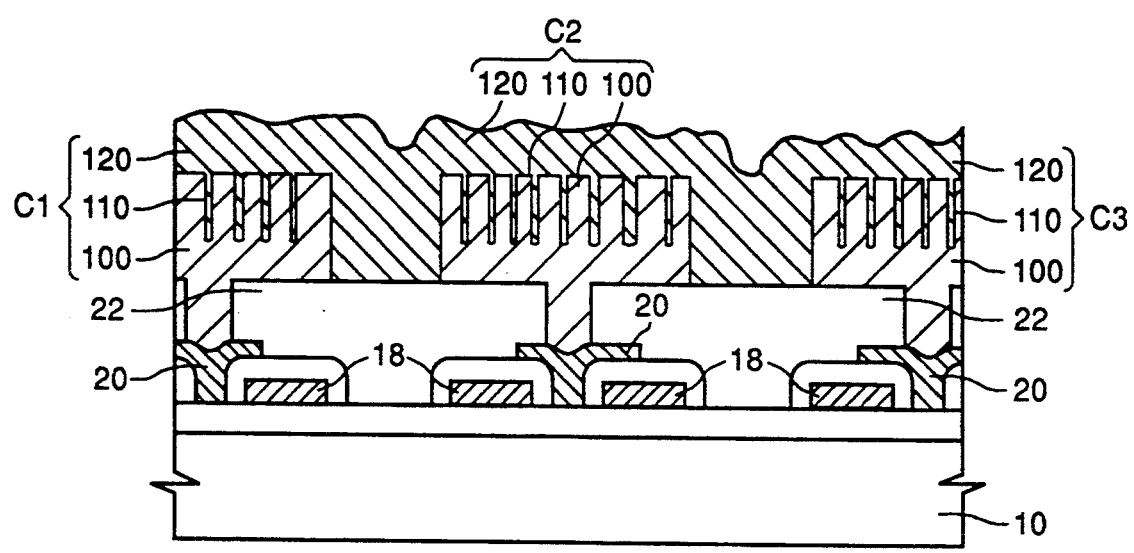

FIG. 20 illustrates a step of forming a storage electrode 100, a dielectric film 110 and a plate electrode 120. The conductive layer is partially removed by anisotropically etching the entire surface of the resultant structure, using the spacer (56 in FIG. 19) and the 2nd first-material layer pattern (50c in FIG. 19) as etch-masks. Therefore, storage electrode 100 composed of a cylinder having a plurality of bars of a predetermined height therein is completed. Dielectric film 110 is formed by coating a high dielectric material on the entire surface of the storage electrode, and plate electrode 120 is formed by depositing a conductive material, e.g., a polysilicon doped with an impurity, on the entire surface of the resultant structure.

In the method according to the third embodiment, the effective area can be increased by the areas of the inner and outer surfaces of the cylinder as compared with those of the first and second embodiments. Also, the bars on the periphery of the storage electrode can be prevented from being broken down, which results in more reliable storage electrode formation.

FIGS. 21 through 25 are sectional views showing a fourth embodiment of the method for manufacturing the capacitor of the highly integrated semiconductor memory device according to the present invention, which is suggested for forming a reliable cylindrical storage electrode. It is also appreciated that the cylindrical storage electrode has a plurality of bars therein.

Figure 21:
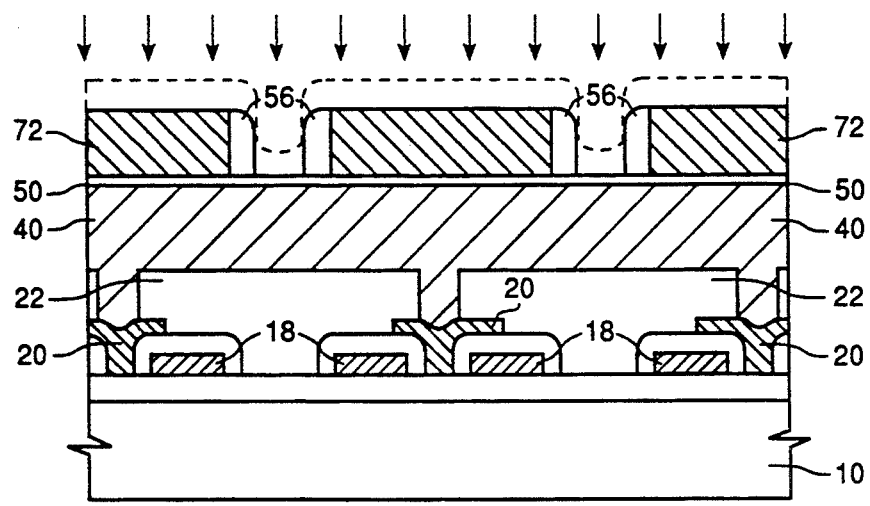
Figure 22:
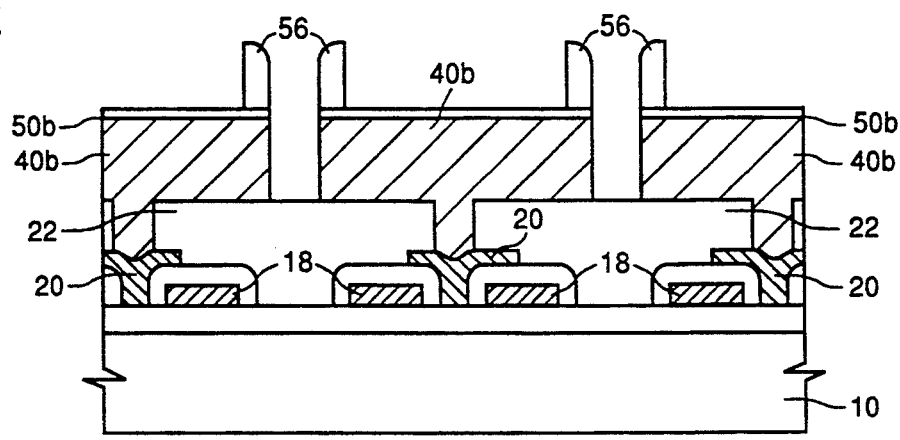
Figure 23:
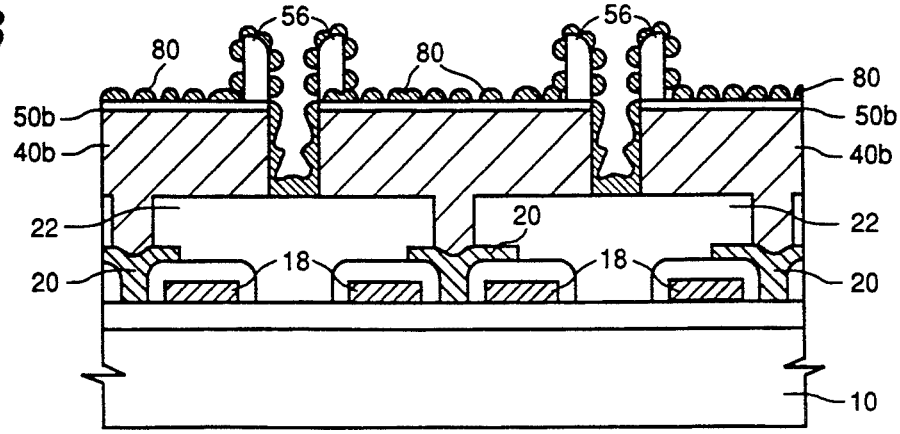

After forming first material layer 50 by performing the step described in FIG. 7 or 11, a material having an etch rate different from that of the material constituting the first material layer with respect to any anisotropic etching (a polysilicon is preferable if first material layer 50 is composed of an oxide), is deposited on the entire surface of the first material layer, thereby forming a sixth material layer. Using mask pattern (P5 in FIG. 1), the sixth material layer is patterned to form a sixth material layer pattern 72 forming a storage electrode which is defined into an individual unit cell. Successively, on a material having an etch rate different from that of the material constituting conductive layer 40 with respect to any anisotropic etching (an oxide is preferable if conductive layer 40 is composed of a polysilicon), is coated on the entire surface of the resultant structure in a thickness of approximately 500 Å to 2,000 Å, so that a seventh material layer is formed. Then, the seventh material layer is anisotropically etched to form a spacer 56 for cylindrical electrode formation on the sidewall of sixth material layer pattern 72 (FIG. 21). Successively, an anisotropic etching is performed on the whole surface of the resultant structure, using the sixth material layer pattern and spacer as an etch-mask. Therefore, a conductive layer pattern 40b is formed and the sixth material layer pattern is eliminated (FIG. 22). Then, an HSG layer 80 is formed on the entire surface of the resultant structure (FIG. 23). After this, a first material layer pattern 50d is formed by anisotropically etching the first material layer (50b in FIG. 23), using the hemispherical grains constituting the HSG layer. Also, the conductive layer pattern (40b in FIG. 23) is anisotropically etched, using the first material layer pattern as an etch-mask. Finally, a cylindrical storage electrode 100 which includes a plurality of bars therein is completed (FIG. 24). After eliminating the spacer and first material layer pattern 50d, a dielectric film 110 is coated on the entire surface of the storage electrode 100. Thereafter, a material, e.g., a polysilicon doped with an impurity, is deposited on the entire surface of the resultant structure, forming a plate electrode 120.

The method according to the fourth embodiment improves the method of the third embodiment (refer to a portion A of FIG. 19) wherein the HSG layer exists under the spacer, so that the spacer can be reliably formed.

FIG. 26 is a sectional view showing a semiconductor memory device manufactured by a fifth embodiment of a method for manufacturing a capacitor of a highly integrated semiconductor memory device according to the present invention, wherein the lower surface of the storage electrode is also utilized as an effective capacitor area for increasing cell capacitance.

As a result, since large cell capacitance can be secured by means of a simple process, the method for manufacturing a capacitor according to the present invention can be adopted to semiconductor memory devices wherein the packing density becomes heightened to 64 Mb and 256 Mb.

The present invention has been particularly described by using the mask pattern shown in FIG. 1, with reference to particular embodiments thereof, but the scope of the present invention to be claimed is not to be limited by the mask pattern. Generally, in place of the mask pattern shown in FIG. 1, a mask pattern of Hitachi Co., which has a sloped active region is generally utilized (see "A New Stacked Capacitor DRAM Cell Characterized by a Storage Capacitor on a Bit-line Structure," Shin Ichiro Kimura et al., in IEDM Tech. Dig., 1988, pp. 596–599).

It will be understood by those skilled in the art that various changes in form and details may be effected therein without departing from the spirit and scope of the invention as defined by the appended claims.

What is claimed is:

1. A method of manufacturing a capacitor electrode of an integrated semiconductor memory device comprising the steps of:
    a) forming a conductive layer on the entire surface of a semiconductor substrate;
    b) forming a first material layer on the entire surface of said conductive layer;
    c) forming a second material layer on the entire surface of said first material layer;
    d) forming a second material layer pattern for storage electrode formation, by patterning said second material layer, using a mask pattern for storage electrode formation;
    e) forming a third material layer on the entire surface of the resultant structure having said second material layer pattern thereon;
    f) forming a spacer on the sidewall of said second material layer pattern by anisotropically etching said third material layer;
    g) forming a first material layer pattern for storage electrode formation by anisotropically etching said first material layer, using said second material layer pattern and said spacer as etch-masks;
    h) forming a conductive layer pattern for storage electrode formation by etching said conductive layer, using said first material layer pattern as an etch-mask;
    i) forming a polysilicon layer having hemispherical grains on the entire surface of the structure resulting from step h, such that some of said hemispherical grains are spaced apart from one another to leave portions of said first material layer partially exposed;
    j) forming an etched first material layer pattern by etching said first material layer, using said hemispherical grains of said polysilicon layer as an etch-mask;
    k) removing said polysilicon layer having hemispherical grains;
    l) partially etching said conductive layer pattern by anisotropically etching said conductive layer, using said etched first material layer pattern as an etch-mask; and
    l) removing said etched first material layer pattern.

2. A method of manufacturing a capacitor of an integrated semiconductor memory device as in claim 1, wherein said first material layer comprises a material having an etch rate different from that of materials constituting said conductive layer, said second material layer and said third material layer.

3. A method of manufacturing a capacitor of an integrated semiconductor memory device as in claim 2, wherein said conductive layer comprises a first polysilicon, said first material layer comprises an oxide, said second material layer comprises a second polysilicon and said third material layer comprises a third polysilicon layer.

4. A method of manufacturing a capacitor electrode of an integrated semiconductor memory device comprising the steps of:
    a) forming a conductive layer on the entire surface of a semiconductor substrate;
    b) forming a first material layer on the entire surface of said conductive layer;
    c) forming a polysilicon layer having a plurality of hemispherical grains on the entire surface of said first material layer, some of said hemispherical grains being sufficiently spaced apart to leave portions of said first material layer exposed;
    d) forming a second material layer on the entire surface of the structure resulting from step c having said polysilicon layer thereon;
    e) forming a second material layer pattern for storage electrode formation by patterning said second material layer, using a mask pattern for storage electrode formation;
    f) forming a third material layer on the whole surface of the structure resulting from step e having said second material layer pattern thereon;
    g) forming a spacer on the sidewall of said second material layer pattern by anisotropically etching said third material layer;
    h) forming a conductive layer pattern for storage electrode formation by anisotropically etching the entire surface of the structure resulting from step g, using said second material layer pattern and said spacer as etch-masks;
    i) removing said second material layer pattern;
    j) forming a first material layer pattern for storage electrode formation by etching said first material layer, using said hemispherical grains of said polysilicon layer as an etch-mask and subsequently removing said polysilicon layer having said hemispherical grains;
    k) completing a storage electrode by partially etching said conductive layer pattern, using said first material layer pattern and said spacer as etch-masks; and
    l) removing said first material layer pattern and said spacer.

5. A method of manufacturing a capacitor of an integrated semiconductor memory device as in claim 4, wherein said first material layer comprises a material having an etch rate different from that of a material constituting said conductive layer with respect to any anisotropic etching.

6. A method of manufacturing a capacitor of an integrated semiconductor memory device as claimed in claim 5, wherein, when said first material layer comprises a material to isolate said hemispherical grains of said polysilicon layer during step c.

* * * * *